(12) United States Patent
Chen et al.

(10) Patent No.: US 12,185,494 B2
(45) Date of Patent: Dec. 31, 2024

(54) HEAT DISSIPATION ASSEMBLY

(71) Applicant: Delta Electronics, Inc., Taoyuan (TW)

(72) Inventors: Chin-Ting Chen, Taoyuan (TW);
Chih-Wei Yang, Taoyuan (TW);
Shu-Cheng Yang, Taoyuan (TW);
Che-Wei Chang, Taoyuan (TW);
Wen-Cheng Huang, Taoyuan (TW);
Chin-Hung Lee, Taoyuan (TW);
Chih-Wei Chan, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 221 days.

(21) Appl. No.: 17/982,260

(22) Filed: Nov. 7, 2022

(65) Prior Publication Data

US 2024/0032236 A1 Jan. 25, 2024

(30) Foreign Application Priority Data

Jul. 22, 2022 (CN) .......................... 202210861799.8

(51) Int. Cl.
*H05K 7/20* (2006.01)
*G06F 1/20* (2006.01)

(52) U.S. Cl.
CPC ..... *H05K 7/20172* (2013.01); *H05K 7/20154* (2013.01); *G06F 1/203* (2013.01)

(58) Field of Classification Search
CPC . H05K 7/20172; H05K 7/20154; G06F 1/203
USPC .................................................... 361/679.47
See application file for complete search history.

(56) References Cited

U.S. PATENT DOCUMENTS

| 7,443,672 | B2* | 10/2008 | Peng ..................... H01L 23/427 |
| | | | 257/E23.084 |
| 7,551,442 | B2* | 6/2009 | Stefanoski ............ H01L 23/467 |
| | | | 361/699 |
| 7,755,902 | B2* | 7/2010 | Peng ......................... G06F 1/20 |
| | | | 361/720 |
| 7,885,073 | B2* | 2/2011 | Peng ..................... H01L 23/467 |
| | | | 165/104.33 |

(Continued)

FOREIGN PATENT DOCUMENTS

| CN | 101754655 B | 3/2013 |
| CN | 203040097 U | 7/2013 |

(Continued)

*Primary Examiner* — Anatoly Vortman
(74) *Attorney, Agent, or Firm* — KIRTON McCONKIE; Evan R. Witt

(57) ABSTRACT

A heat dissipation assembly is disclosed and includes a fan, a vapor chamber and a heat dissipation fin set. The fan includes a fan frame, an impeller and a fan cover. The impeller is disposed on the fan frame and accommodated in an accommodation space. The impeller includes plural metal blades and a hub, and the plural metal blades are radially arranged on the periphery of the hub to form a dense-metal-blade impeller. The fan cover is assembled with the fan frame to form an outlet, and the fan cover includes an inlet. The vapor chamber includes an upper plate and a lower plate assembled with each other. The upper plate or the lower plate is connected to the fan cover, and the vapor chamber and the fan cover are coplanar. The heat dissipation fin set is connected to the lower plate and spatially corresponding to the outlet.

4 Claims, 18 Drawing Sheets

(56) References Cited

U.S. PATENT DOCUMENTS

| | | | | |
|---|---|---|---|---|
| 7,990,712 B2* | 8/2011 | Fang | ................... | G06F 1/20 |
| | | | | 361/679.52 |
| 8,159,819 B2* | 4/2012 | Memon | ............... | H01L 23/427 |
| | | | | 361/679.48 |
| 8,514,574 B2* | 8/2013 | Fu | .................... | H05K 7/20727 |
| | | | | 165/185 |
| 10,001,128 B2* | 6/2018 | Lin | .................... | F04D 29/023 |
| 10,794,393 B2* | 10/2020 | Huang | ............... | F04D 29/388 |
| 11,286,947 B2* | 3/2022 | Horng | ............... | F04D 29/384 |
| 11,536,286 B2* | 12/2022 | Shah | .................. | G06F 1/203 |
| 11,719,252 B2* | 8/2023 | Lin | ................. | H05K 7/20172 |
| | | | | 416/182 |
| 2003/0000684 A1* | 1/2003 | Huang | ............... | F04D 29/582 |
| | | | | 257/E23.099 |
| 2009/0059525 A1* | 3/2009 | Peng | .................. | H01L 23/467 |
| | | | | 361/697 |
| 2016/0290355 A1* | 10/2016 | Lin | .................... | F04D 29/023 |
| 2017/0367219 A1 | 12/2017 | Hsieh et al. | | |
| 2020/0081505 A1 | 3/2020 | Ma et al. | | |

FOREIGN PATENT DOCUMENTS

| | | |
|---|---|---|
| CN | 215927821 U | 3/2022 |
| TW | I599755 B | 9/2017 |

\* cited by examiner

HEAT DISSIPATION ASSEMBLY

CROSS-REFERENCE TO RELATED APPLICATION

This application claims priority to China Patent Application No. 202210861799.8, filed on Jul. 22, 2022. The entire contents of the above-mentioned patent application are incorporated herein by reference for all purposes.

FIELD OF THE INVENTION

The present disclosure relates to a heat dissipation assembly, and more particularly to a heat dissipation assembly combining a dense-metal-blade fan and a vapor chamber for optimizing the stacked vertical height of the entire assembled structure, increasing the thermal-conduction area and the heat-dissipation area, and improving the heat-dissipation efficiency at the same time.

BACKGROUND OF THE INVENTION

Fans are used in many heat dissipation systems and specially designed for different application environments. For example, cooling fans used in the notebook computers are designed to increase the number of blades to optimize the continuity of the flow field, so as to achieve the effect of reducing noise.

In an existing design of the fun, a plurality of metal blades are stamped to have different lengths and shapes, and then packaged and fixed on a plastic disc. In that, the thinnest blades and the largest number of blades are obtained, so as to achieve the effects of reducing noise and increasing the airflow rate of the fan. Such dense-metal-blade fan still needs to be assembled with a corresponding cooling module to further improve the heat-dissipation performance of the fan.

However, due to the limitations, such as the entire height of the application environment for the dense-metal-blade fan, it is difficult to combine the dense-metal-blade fan with an additional heat-dissipation module to increase the heat-dissipation area or the thermal conduction area. Furthermore, when a traditional heat sink is added to the dense-metal-blade fan, the stacking height of the system is increased. The conventional heat dissipation assembly of the dense-metal-blade fan and the heat-dissipation module is not suitable for use in notebook computers, and not capable of reducing the temperature of case effectively.

Therefore, there is a need of providing a heat dissipation assembly including a vapor chamber combined with a dense-metal-blade fan to optimize the stacked vertical height of the entire assembled structure, increase the thermal-conduction area and the heat-dissipation area, improve the heat-dissipation efficiency and obviate the drawbacks encountered by the prior arts.

SUMMARY OF THE INVENTION

An object of the present disclosure is to provide a heat dissipation assembly. A dense-metal-blade fan and a vapor chamber are combined to optimize the stacked vertical height of the entire assembled structure, increase the thermal-conduction area and the heat-dissipation area, and improve the heat-dissipation efficiency at the same time. The vapor chamber is thermally coupled to the fan frame through the fan cover, or the upper or lower plate of the vapor chamber is extended to cover the fan frame to form the heat dissipation assembly. The assembling process is simplified. Moreover, the combination of the vapor chamber and the dense-metal-blade fan is allowed to form a smaller stacked vertical height. Furthermore, in case of that the system stacking space is limited, it is allowed to extend the vapor chamber horizontally to increase the overall heat-dissipation area and improve the heat-dissipation efficiency.

Another object of the present disclosure is to provide a heat dissipation assembly. By combining the vapor chamber and the dense-metal-blade fan, it has advantages of reducing the system stacking space and optimizing the heat-dissipation efficiency. When the vapor chamber is extended and combined with the fan frame as the base, and further combined with the heat dissipation fin set and assembled with the dense-metal-blade impeller, a smaller stacked vertical height is formed. The vapor chamber has a bent section connected to a device-attaching section thermally coupled with the heat-generating device, so as to achieve the heat dissipation of the heat-generating device outside the system In addition, the two opposite ends of the vapor chamber are allowed to connect and thermally coupled to the fan frame and the fan cover, respectively, through the upper plate or the lower plate of the vapor chamber, so as to increase the variability of multiple applications and enhance the competitiveness of the product.

A further object of the present disclosure is to provide a heat dissipation assembly. When a fan is combined with a vapor chamber and a heat dissipation fin set to form a heat dissipation assembly applied to an advanced notebook, it facilitates the dense-metal-blade impeller to exert the performance. That is, the frequency energy of the fan blades is dispersed evenly by using the fan blades with different blade lengths, the noise is reduce, and the performance is enhanced. Furthermore, with a larger heat-dissipation area and a larger heat-conduction area provided by the vapor chamber, the heat from the heat-generating device disposed outside the system is dissipated effectively through the combination of the vapor chamber, the fan and the heat dissipation fin set. On the other hand, the combination of the fan and the vapor chamber minimizes the stacked vertical height, and it is helpful of reducing the overall system stacking space, exerting the effect of reducing the temperature of the notebook case, and enhancing the competitiveness of the product.

In accordance with an aspect of the present disclosure, a heat dissipation assembly is provided and includes a fan, a vapor chamber and a heat dissipation fin set. The fan includes a fan frame, an impeller and a fan cover. The fan frame includes an accommodation space, the impeller is disposed on the fan frame and accommodated in the accommodation space, and the impeller includes a plurality of metal blades and a hub. The plurality of metal blades are radially arranged on a periphery of the hub to form a dense-metal-blade impeller with a number of outer-ring blades greater than a number of inner-ring blades, the fan cover is assembled with the fan frame to form an outlet, and the fan cover includes an inlet spatially corresponding to the impeller and in communication with the outlet through the accommodation space. The vapor chamber includes an upper plate and a lower plate spatially corresponding to each other and assembled to form the vapor chamber. At least one of the upper plate and the lower plate is connected and thermally coupled to the fan cover, and the vapor chamber and the fan cover are coplanar to form a coplanar surface. The heat dissipation fin set is connected to the lower plate and spatially corresponding to the outlet.

In an embodiment, a stacked vertical height is formed between a top surface of the fan cover and a bottom surface of the fan frame, wherein the vapor chamber includes a bent section and a device-attaching section, the bent section and the device-attaching section are misaligned to the fan in view of a vertical direction, and vertical heights of the bent section and the device-attaching section relative to the bottom surface of the fan frame are less than or equal to the stacked vertical height.

In an embodiment, at least one heat-generating device is attached to the device-attaching section, and a thickness of the at least one heat-generating device is less than the stacked vertical height.

In an embodiment, the lower plate of the vapor chamber and the fan cover are coplanar to form the coplanar surface.

In an embodiment, the fan cover further includes a clamping element disposed adjacent to a join of the fan cover and the vapor chamber, and extended from the fan cover to cover the upper plate of the vapor chamber.

In an embodiment, when the fan cover and the fan frame are assembled by a fastening element, the clamping element pushes against the upper plate of the vapor chamber, so that a joining end of the vapor chamber adjacent to the fan cover is fastened between the clamping element and the fan frame.

In accordance with another aspect of the present disclosure, a heat dissipation assembly is provided and includes a fan, a vapor chamber and a heat dissipation fin set. The fan includes a fan frame and an impeller. The fan frame includes an accommodation space, the impeller is disposed on the fan frame and accommodated in the accommodation space, and the impeller includes a plurality of metal blades and a hub. The plurality of metal blades are radially arranged on a periphery of the hub to form a dense-metal-blade impeller with a number of outer-ring blades greater than a number of inner-ring blades. The vapor chamber includes an upper plate and a lower plate spatially corresponding to each other and assembled to form the vapor chamber. The lower plate has an extending section extended to cover the fan frame, the extending section of the lower plate is assembled with the fan frame to form an outlet, and the extending section includes an inlet spatially corresponding to the impeller and in communication with the outlet through the accommodation space. The heat dissipation fin set is connected to the lower plate and spatially corresponding to the outlet.

In an embodiment, a stacked vertical height is formed between a top surface of the upper plate of the vapor chamber and a bottom surface of the fan frame, wherein the vapor chamber includes a bent section and a device-attaching section, the bent section and the device-attaching section are misaligned to the fan in view of a vertical direction, and vertical heights of the bent section and the device-attaching section relative to the bottom surface of the fan frame are less than or equal to the stacked vertical height.

In an embodiment, at least one heat-generating device is attached to the device-attaching section, and a thickness of the at least one heat-generating device is less than the stacked vertical height.

In an embodiment, the extending section of the vapor chamber and the fan frame are assembled by a fastening element In accordance with a further aspect of the present disclosure, a heat dissipation assembly is provided and includes a first fan, a vapor chamber and a heat dissipation fin set. The vapor chamber includes an upper plate and a lower plate spatially corresponding to each other and assembled to form the vapor chamber. The first fan includes a first fan frame, a first impeller and a first fan cover. The lower plate of the vapor chamber includes an extending section extended to cover the first fan frame, and an accommodation space is formed collaboratively by the first fan frame and the extending section of the lower plate. The first impeller is disposed in the accommodation space, and the first impeller includes a plurality of metal blades and a hub, wherein the plurality of metal blades are radially arranged on a periphery of the hub to form a dense-metal-blade impeller with a number of outer-ring blades greater than a number of inner-ring blades. The first fan cover and the extending section of the lower plate are connected through the first fan frame to collaboratively form a first outlet, and the first fan cover includes a first inlet spatially corresponding to the first impeller and in communication with the first outlet through the accommodation space. The heat dissipation fin set is connected to the upper plate and spatially corresponding to the first outlet.

In an embodiment, a stacked vertical height is formed between a top surface of the first fan cover and a bottom surface of the extending section of the lower plate, wherein the vapor chamber includes a bent section and a device-attaching section, the bent section and the device-attaching section are misaligned to the first fan in view of a vertical direction, and vertical heights of the bent section and the device-attaching section relative to the bottom surface of the extending section of the lower plate are less than or equal to the stacked vertical height.

In an embodiment, at least one heat-generating device is attached to the device-attaching section, and a thickness of the at least one heat-generating device is less than the stacked vertical height.

In an embodiment, the vapor chamber further includes a horizontal combining section extended horizontally from the device-attaching section, wherein the horizontal combining section, the device-attaching section and the bent section are misaligned to the first fan in view of the vertical direction.

In an embodiment, the heat dissipation assembly further includes a second fan having a second fan frame, a second impeller and a second fan cover, wherein the second impeller is disposed in the second fan frame, wherein the second fan cover and the second frame are assembled to collaboratively form a second outlet, and the second fan cover includes a second inlet spatially corresponding to the second impeller and in communication with the second outlet, wherein when the second fan cover is assembled with the second fan frame, the horizontal combining section is at least partially clamped between the second fan cover and the second fan frame.

In an embodiment, vertical heights of a top surface of the second fan cover and a bottom surface of the second fan frame relative to the bottom surface of the extending section are less than or equal to the stacked vertical height.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
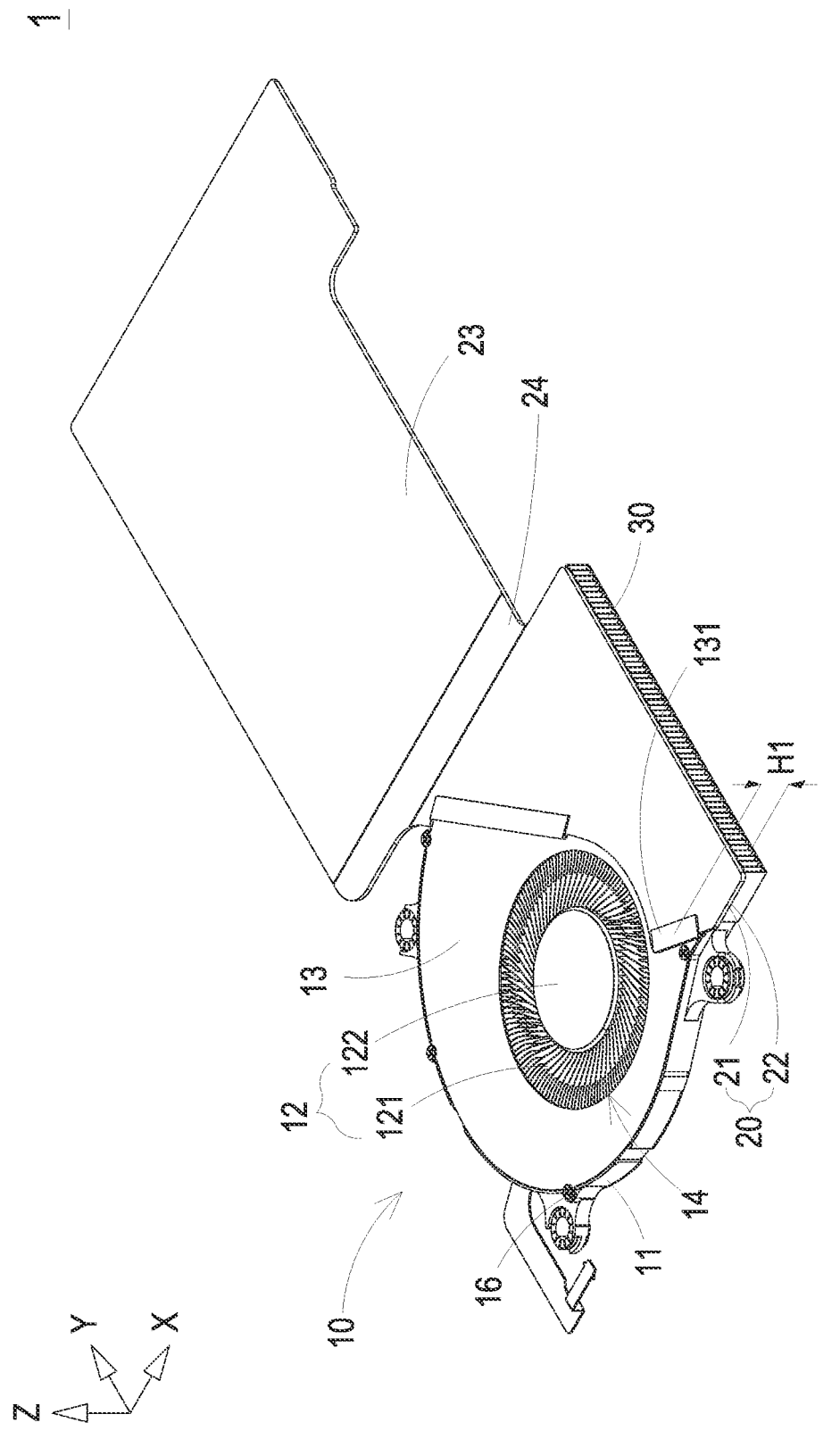
FIG. 1 is a perspective view illustrating a heat dissipation assembly according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "upper," "lower," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 2:
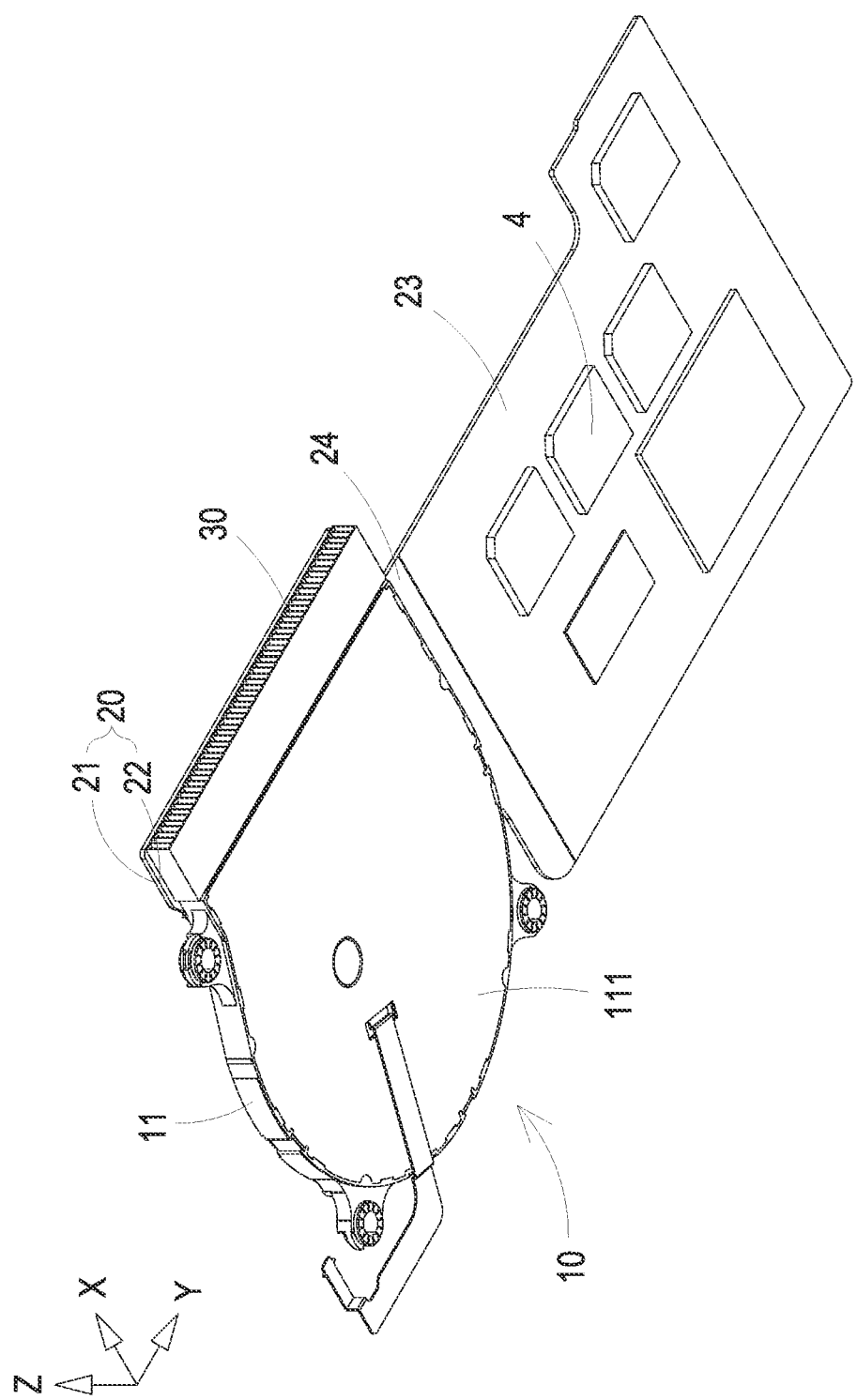
FIG. 2 is a perspective view illustrating the heat dissipation assembly according to the first embodiment of the present disclosure and taken from another perspective.
Figure 3:
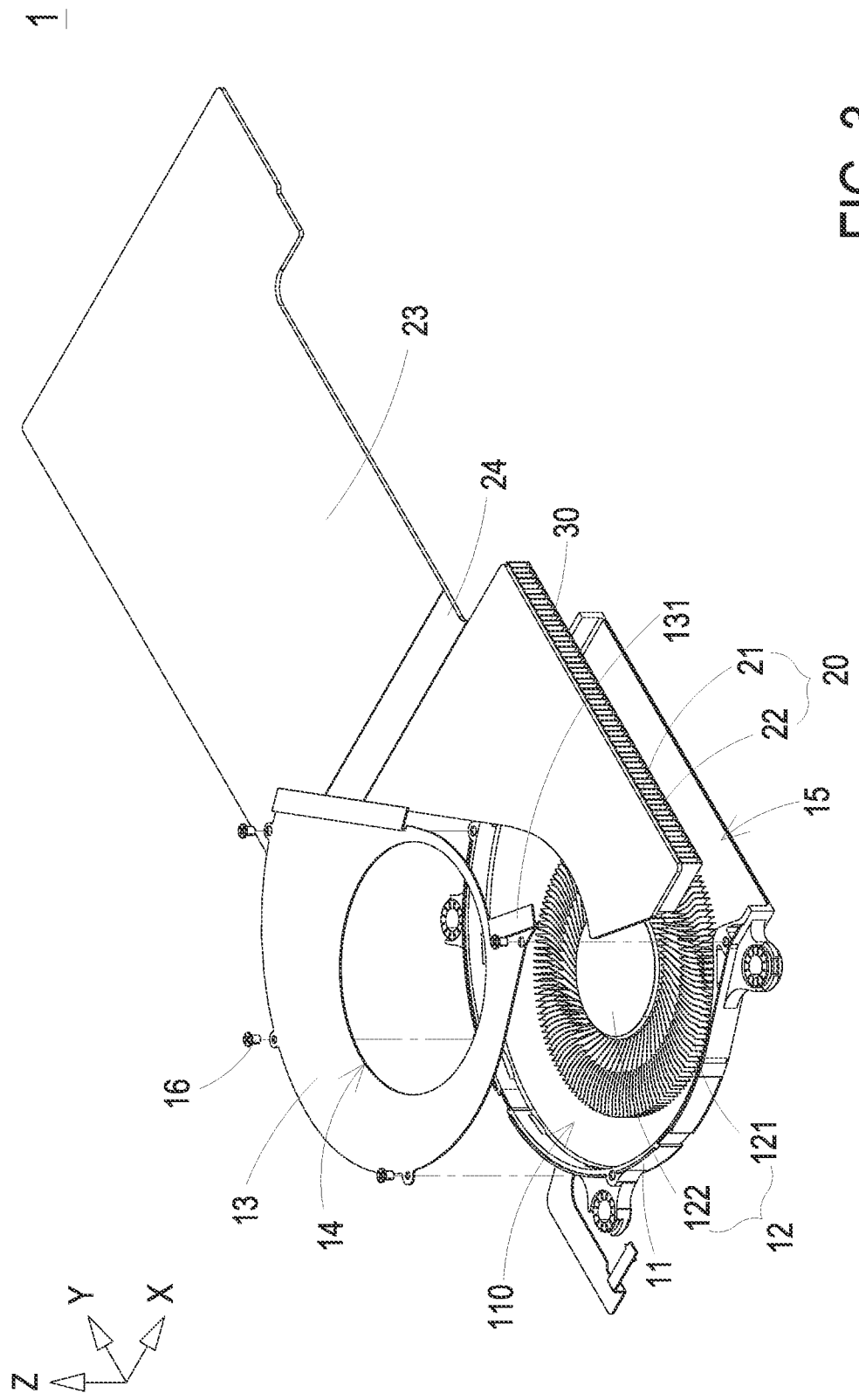
FIG. 3 is an exploded view illustrating the heat dissipation assembly according to the first embodiment of the present disclosure.
Figure 4:
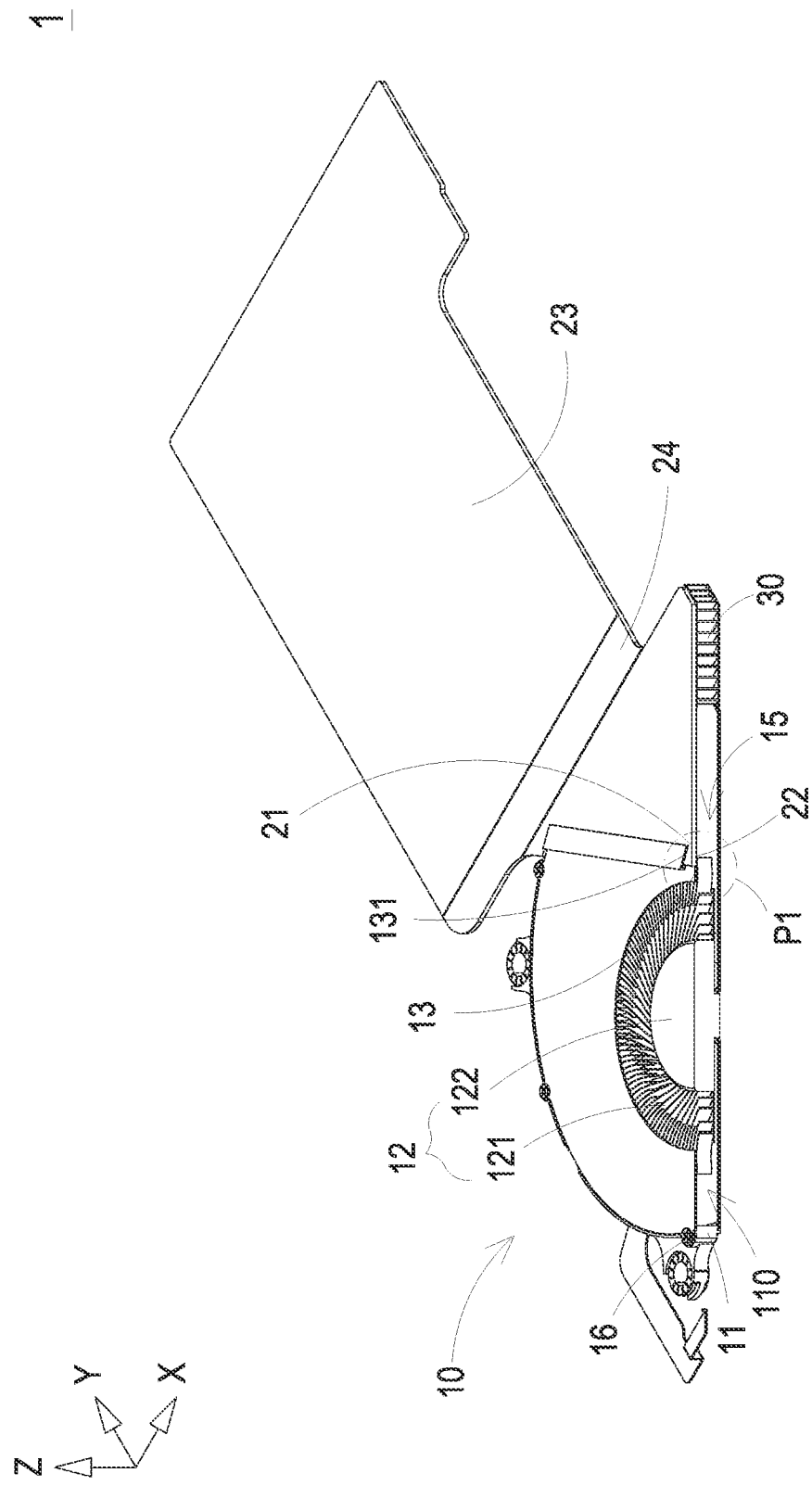
FIG. 4 is a cross-section view illustrating the heat dissipation assembly according to the first embodiment of the present disclosure.
Figure 5:
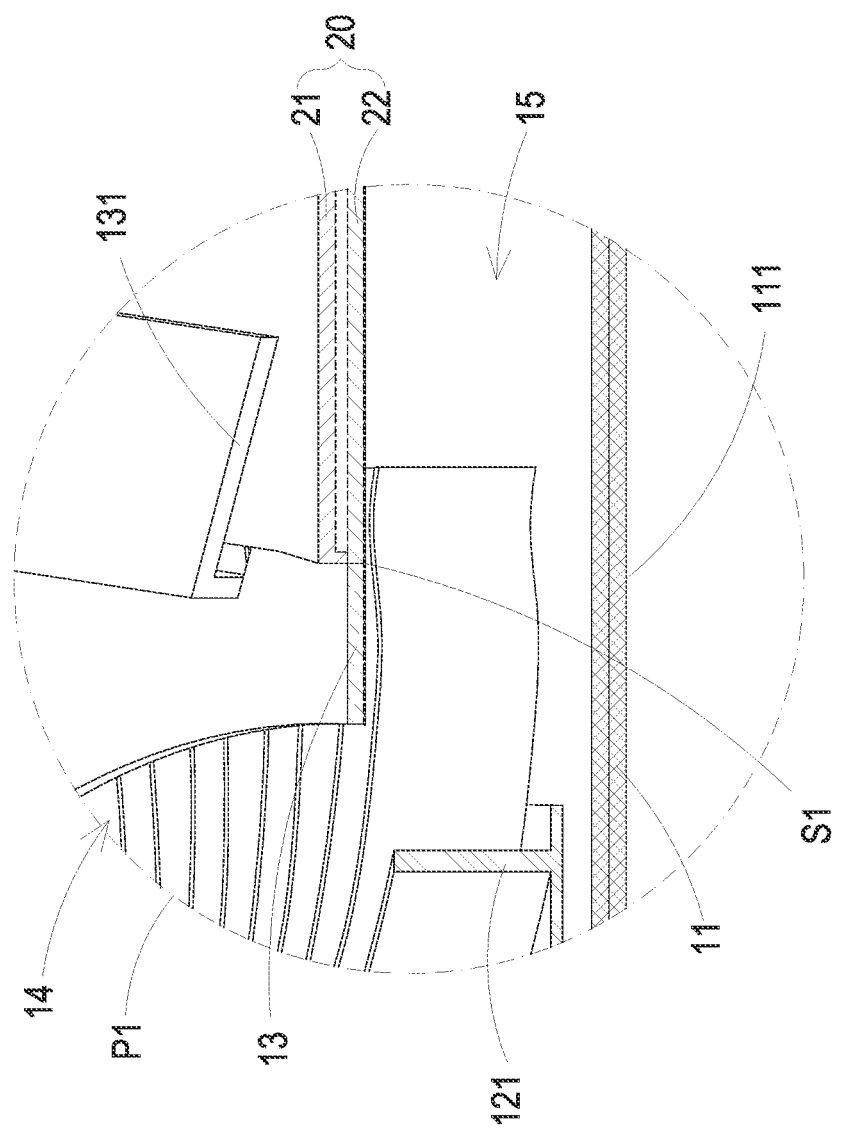
FIG. 5 is an enlarged view showing the region P1 in FIG. 4.

FIG. 1 and FIG. 2 are perspective views illustrating a heat dissipation assembly according to a first embodiment of the present disclosure. FIG. 3 is an exploded view illustrating the heat dissipation assembly according to the first embodiment of the present disclosure. FIG. 4 is a cross-section view illustrating the heat dissipation assembly according to the first embodiment of the present disclosure. FIG. 5 is an enlarged view showing the region P1 in FIG. 4. In the embodiment, the heat dissipation assembly 1 includes a fan 10, a vapor chamber 20 and a heat dissipation fin set 30. The fan 10 includes a fan frame 11 and an impeller 12 and a fun cover 13. The fan frame 11 includes an accommodation space 110. The impeller 12 is disposed on the bottom base of the fan frame 11 and accommodated in the accommodation space 110. In the embodiment, the impeller 12 includes a plurality of metal blades 121 and a hub 122. The plurality of metal blades 121 are radially arranged on a periphery of the hub 122 to form a dense-metal-blade impeller. Notably, the plurality of metal blades 121 have different blade lengths. Preferably but not exclusively, the plurality of metal blades 121 are arranged around the periphery of the hub 122 by means of injection molding to form a dense-metal-blade impeller with a number of outer-ring blades greater than a number of inner-ring blades. In an embodiment, the plurality of metal blades 121 with different blade lengths are divided into the outer-ring blades and the inner-ring blades by an outer ring. Preferably but not exclusively, in case of that the plurality of metal blades 121 with a longer blade length and a shorter blade length are spaced apart and disposed around the periphery of the hub 122, the metal blades 121 with the longer blade length pass through the outer ring and are extended inwardly toward the hub 121. Moreover, the metal blades 121 with the shorter blade length pass through the outer ring merely. In that, the dense-metal blade impeller is formed by the plurality of metal blades 121 with different blade lengths, and the number of the outer-ring blades is twice as many as the number of the inner-ring blades. The frequency energy of the fan blades is dispersed evenly. It is helpful of reducing the noises and enhancing the performance. Certainly, the numbers and the formations of the dense-metal blade impeller of the present disclosure are not limited thereto, and not redundantly described hereafter. Preferably but not exclusively, in the embodiment, a metal sheet is stamped to form the fan cover 13 including an inlet 14. Preferably but not exclusively, the fan cover 13 is assembled with the fan frame 11 by a fastening element 16, such as the screw, so as to form an outlet 15. In the embodiment, the inlet 14 on the fan cover 13 is spatially corresponding to the impeller 12 and in communication with the outlet 15 through the accommodation space 110. In the embodiment, the vapor chamber 20 includes an upper plate 21 and a lower plate 22, spatially corresponding to each other and assembled to form the vapor chamber 20. Notably, the vapor chamber 20 formed and assembled by the upper plate 21 and the lower plate 22 is a bendable plate structure. In the embodiment, a lateral end of the lower plate 22 is connected to a lateral end the fan cover 13, and the lower plate 22 and the fan cover 13 are coplanar, so as to an coplanar surface S 1. In an embodiment, the lateral end of the fan cover 13 is connected to a lateral end of the upper plate 21, so as to form the coplanar surface S 1. In other embodiments, at least one of the upper plate 21 and the lower plate 22 of the vapor chamber 20 is connected and thermally coupled to the fan cover 13, and the vapor chamber 20 and the fan cover 13 are coplanar to form at least one coplanar surface. The present disclosure is no limited thereto. In the embodiment, the heat dissipation fin set 30 is spatially corresponding to the outlet 15 of the fan 10, and connected to the lower plate 22 of the vapor chamber 20 by for example but not limited to welding.

In the embodiment, the fan cover 13 further includes a clamping element 131 disposed adjacent to a join of the fan cover 13 and the vapor chamber 20, and extended from the fan cover 13 to cover the upper plate 21 of the vapor chamber 20. Preferably but not exclusively, in the embodiment, the heat dissipation fin set 30 is preset on the lower plate 22 of the vapor chamber 20 by welding. In the assembling process, the heat dissipation fin set 30 is arranged adjacent to the fan frame 11, and the join of the vapor chamber 20 and the fan cover 13 is placed on the fan frame 11. When the fan cover 13 and the fan frame 11 are assembled by the fastening element 16, the clamping element 131 pushes against the upper plate 21 of the vapor chamber 20, so that a joining end of the vapor chamber 20 adjacent to the fan cover 13 is fixed between the clamping element 131 and the fan frame 11. In that, the lower plate 22 of the vapor chamber 20 and the fan cover 13 are allowed to form a coplanar surface Si on the fan frame 11, and the lateral end of the lower plate 22 of the vapor chamber 20 and the lateral end of the fan cover 13 are thermally coupled and connected to each other. Moreover, the clamping element 131 is thermally coupled with the upper plate 21 of the vapor chamber 20 to improve the heat-dissipation efficiency between the fan 10 and the vapor chamber 20. Certainly, the combination manner of the vapor chamber 20 and the fan cover 13 is not an essential feature to limit the present disclosure. In other embodiments, the clamping element 131 of the fan cover 13 is omitted, and the connection between the fan cover 13 and the vaporizing plate 20 are accomplished by for example but not limited to welding.

Notably, in the embodiment, a stacked vertical height H1 is formed between a top surface of the fan cover 13 (i.e., a top surface of the clamping element 131) and a bottom surface 111 of the fan frame 11 in the Z axial direction. Preferably but not exclusively, the stacked vertical height H1 is regarded as the height limit for the heat dissipation assembly 1 applied to the notebook case. In the embodiment, the vapor chamber 20 further includes a bent section 24 and a device-attaching section 23. The bent section 24 and the device-attaching section 23 are misaligned to the fan 10 in view of a vertical direction (i.e., the Z axial direction). Moreover, vertical heights of the bent section 24 and the device-attaching section 23 relative to the bottom surface 111 of the fan frame 11 are less than or equal to the stacked vertical height H1. In the embodiment, at least one heat-generating device 4 is attached to the device-attaching section 23, and a thickness of the at least one heat-generating device 4 is less than the stacked vertical height H1. Under the height limit of the stacked vertical height H1 in the heat dissipation assembly 1, it allows to adjust the vertical of the device-attaching section 23 relative to the bottom surface 111 of the fan frame 11 in accordance with the thickness of the at least one heat-generating device 4. Preferably but not exclusively, in the embodiment, the bent section 24 is disposed between the fan 10 and the device-attaching section 23, and the heat-generating device 4 is disposed on the lower plate 22 in the device-attaching section 23. Preferably but not exclusively, in an embodiment, the bent section 24 is disposed between the fan 10 and the device-attaching section 23, and the heat-generating device 4 is disposed on the upper plate 21 in the device-attaching section 23. In other words, it allows to adjust the vertical height of the heat-generating device 4 and the vertical height of the device-attaching section 23 relative to the bottom surface 111 of the sector frame 11 arbitrarily, and the present disclosure is not limited thereto.

Notably, in the embodiment, when the fan 10 is combined with the vapor chamber 20 and the heat dissipation fin set 30 to form a heat dissipation assembly 1 applied to an advanced notebook, the overall height of the heat dissipation assembly 1 of the present disclosure is controlled and limited within the range of the stacked vertical height H1. It facilitates the dense-metal-blade impeller 12 included in the fan 10 to exert the performance and disperse the frequency energy of the fan blades evenly, so that the noise is reduce and the performance is enhanced. Furthermore, with a larger heat-dissipation area and a larger heat-conduction area provided by the vapor chamber on the XY-plane, the heat generated from the heat-generating device 4 disposed outside the system is dissipated effectively through the combination of the vapor chamber 20, the fan 10 and the heat dissipation fin set 30. Since the combination of the fan 10, the vapor chamber 20 and heat dissipation fin set 30 minimizes the stacked vertical height H1 of the heat dissipation assembly 1, it is helpful of reducing the overall system stacking space, exerting the effect of reducing the temperature of the notebook case, and enhancing the competitiveness of the product. Certainly, the heat dissipation assembly structure 1 of the present disclosure is applicable to a limited stacking space of for example but not limited to the advanced notebook, and it is described first.

Figure 6:
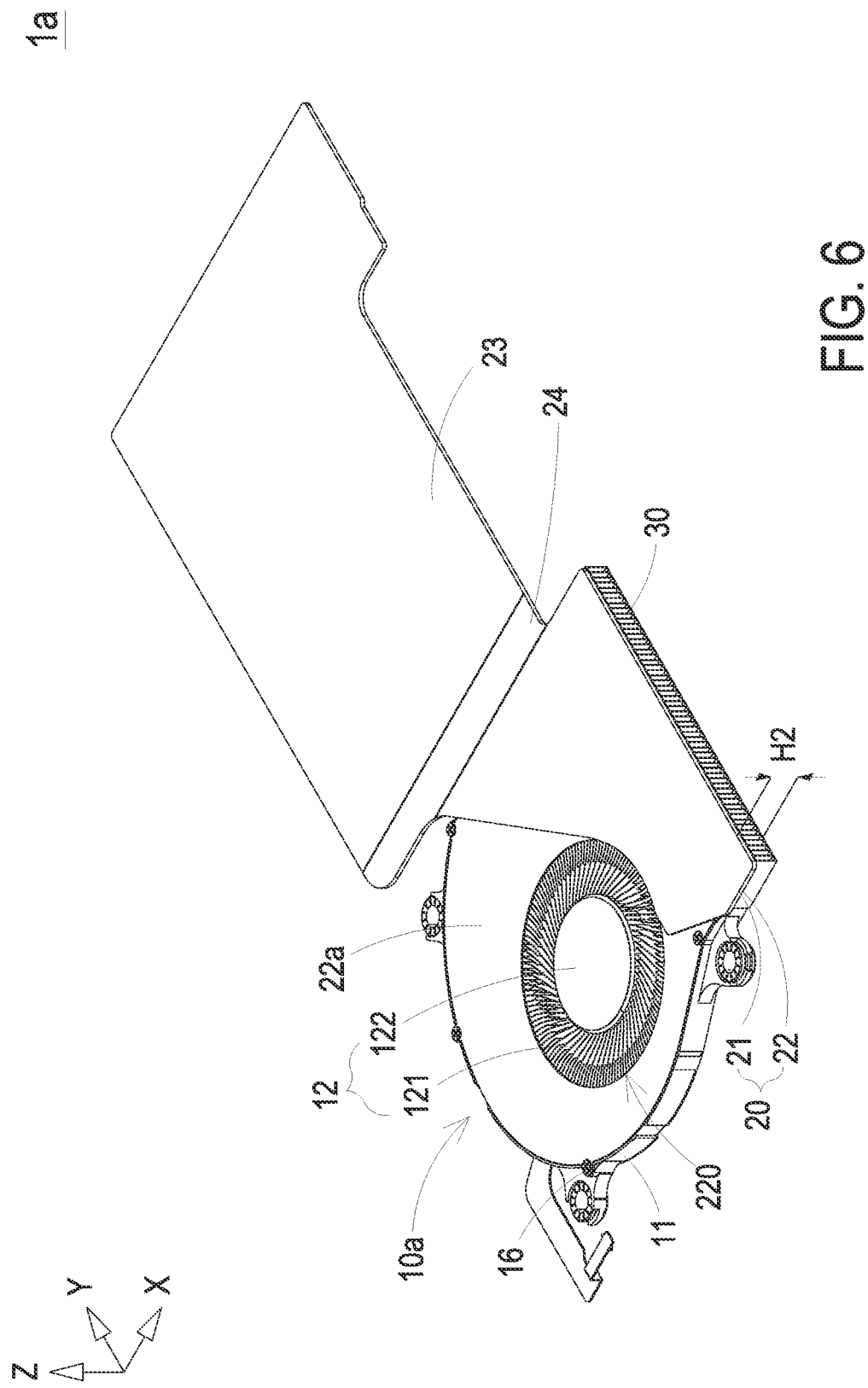
FIG. 6 is a perspective view illustrating a heat dissipation assembly according to a second embodiment of the present disclosure.
Figure 7:
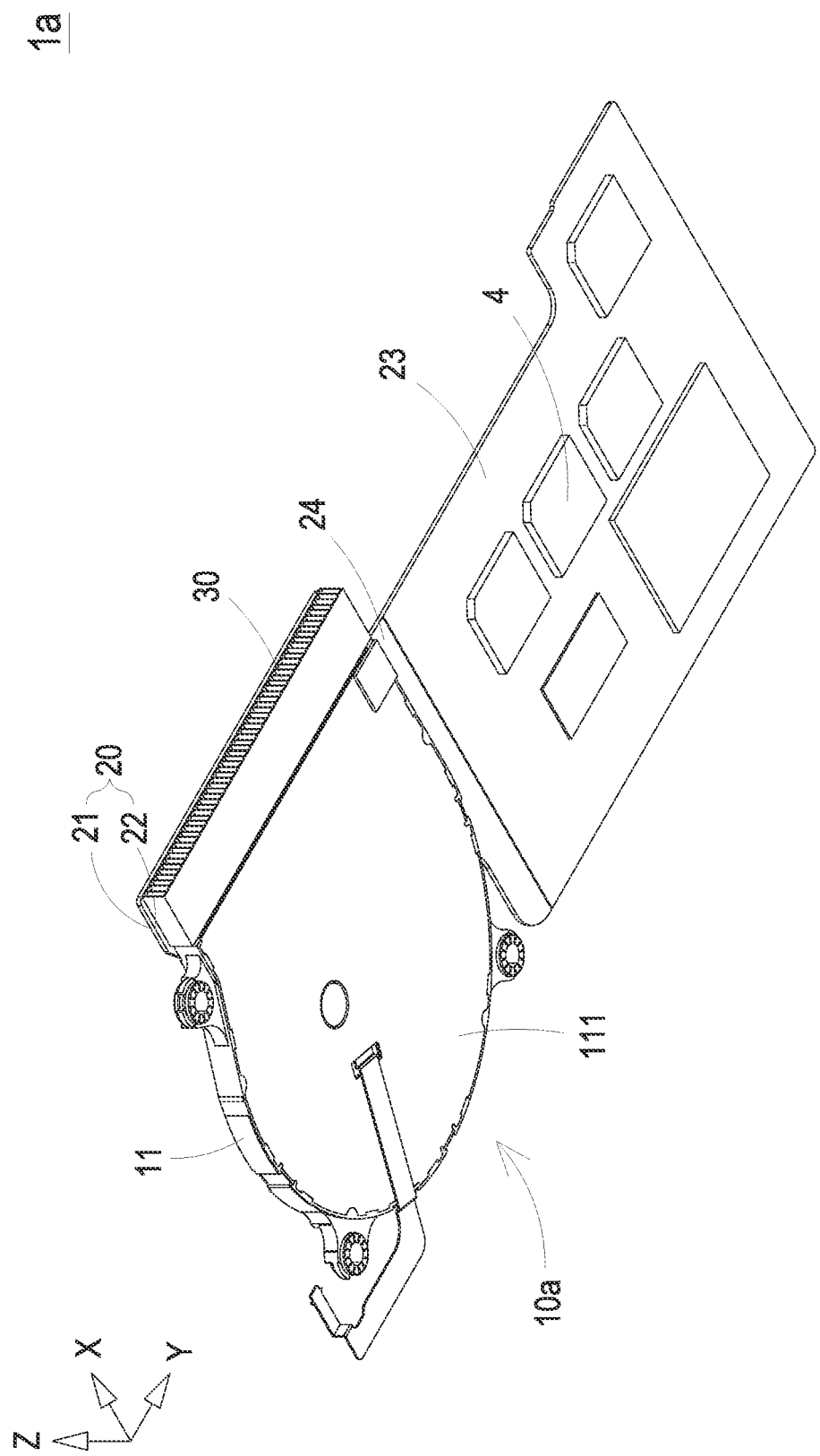
FIG. 7 is a perspective view illustrating the heat dissipation assembly according to the second embodiment of the present disclosure and taken from another perspective.
Figure 8:
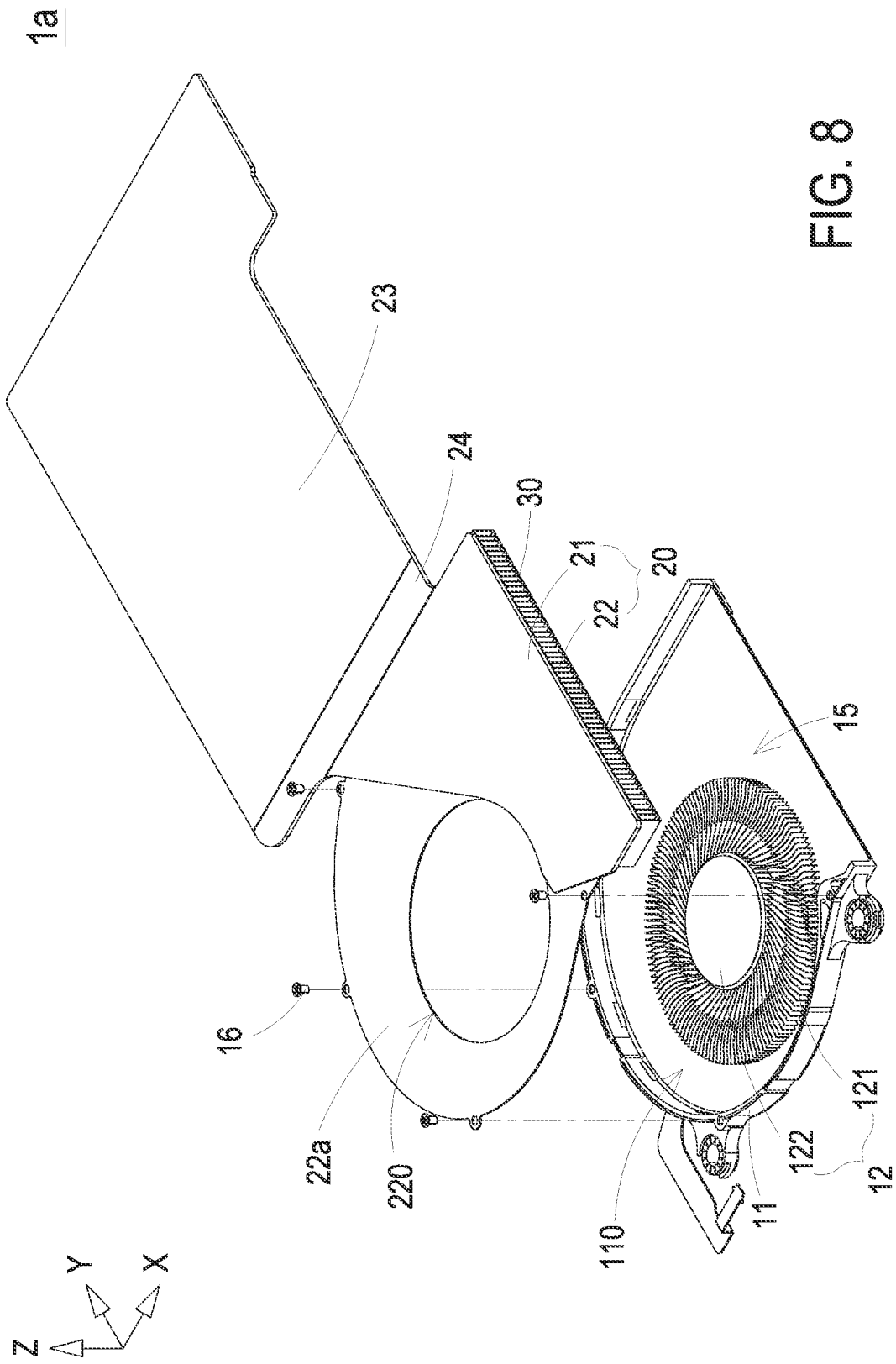
FIG. 8 is an exploded view illustrating the heat dissipation assembly according to the second embodiment of the present disclosure.
Figure 9:
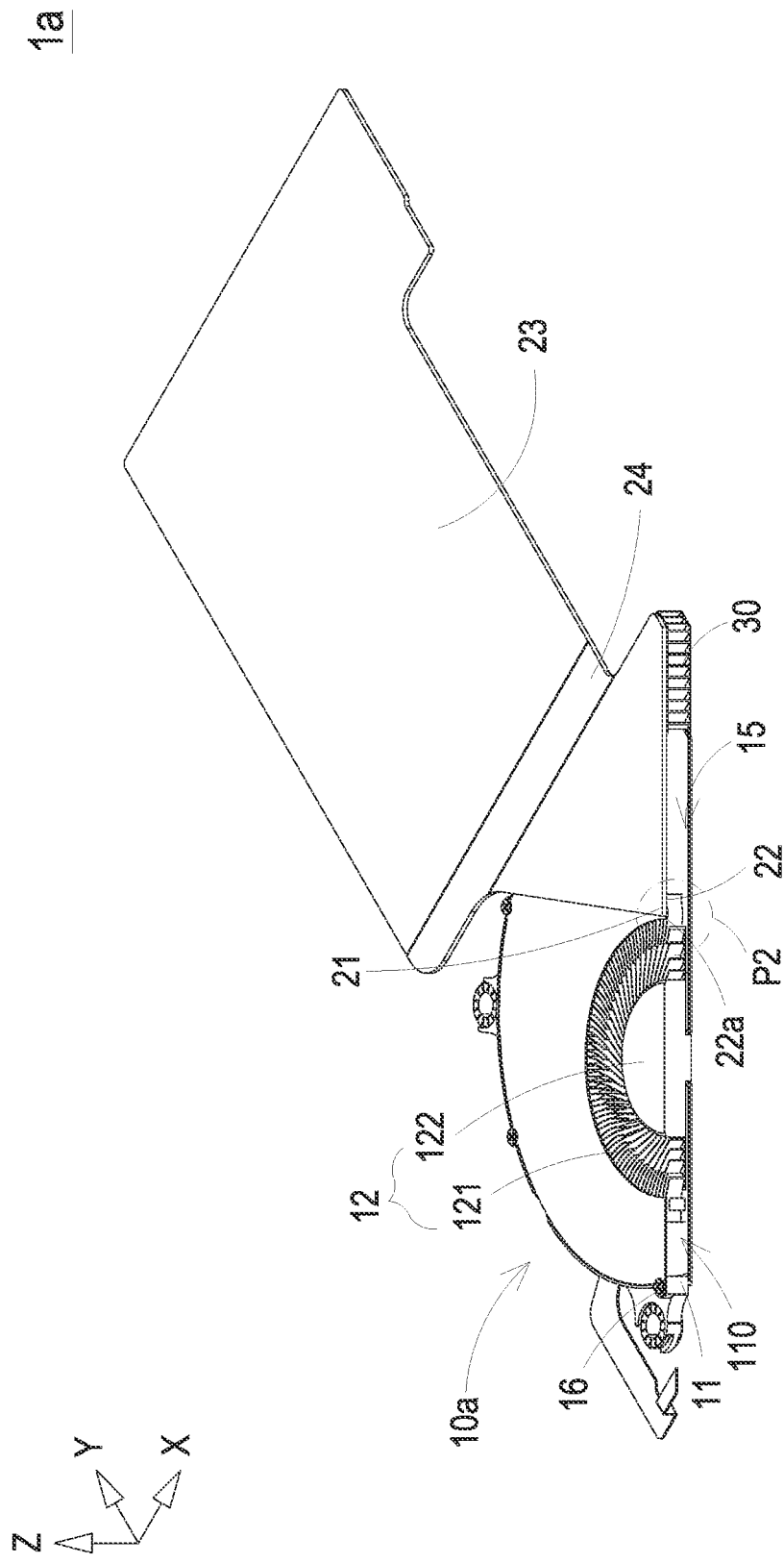
FIG. 9 is a cross-section view illustrating the heat dissipation assembly according to the second embodiment of the present disclosure.
Figure 10:
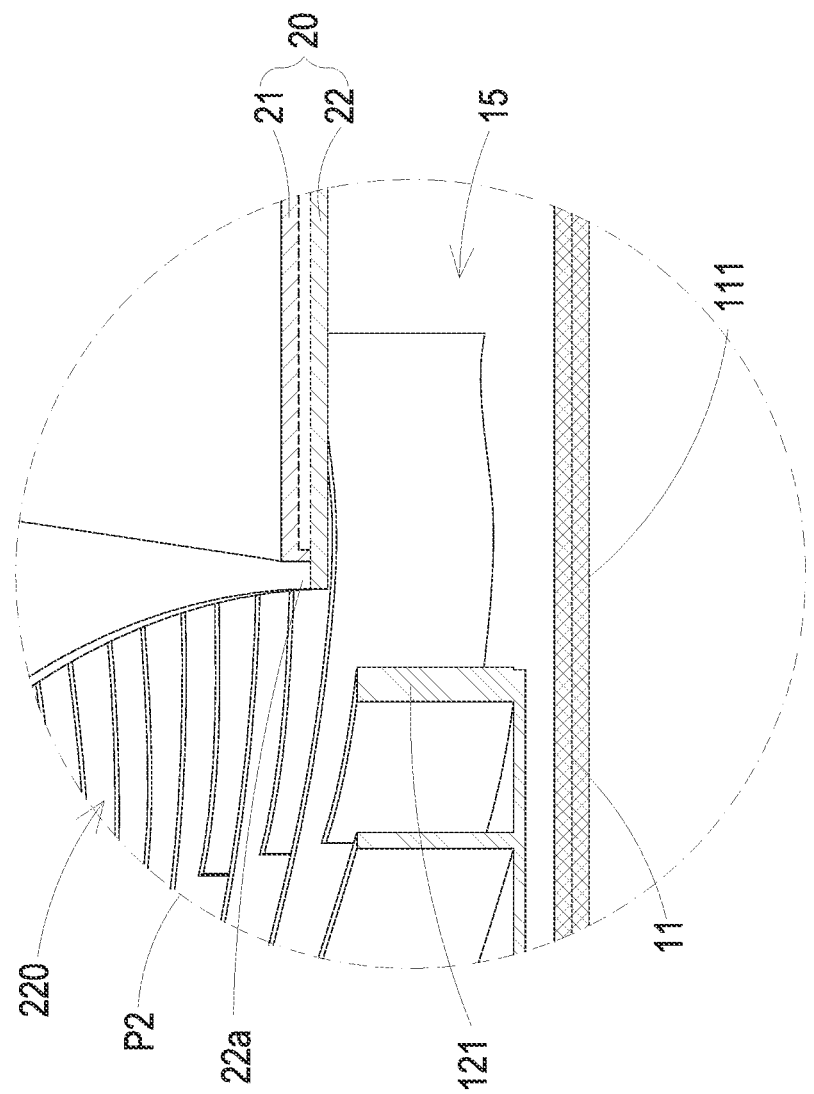
FIG. 10 is an enlarged view showing the region P2 in FIG. 9.

FIG. 6 and FIG. 7 are perspective views illustrating a heat dissipation assembly according to a second embodiment of the present disclosure. FIG. 8 is an exploded view illustrating the heat dissipation assembly according to the second embodiment of the present disclosure. FIG. 9 is a cross-section view illustrating the heat dissipation assembly according to the second embodiment of the present disclosure. FIG. 10 is an enlarged view showing the region P2 in FIG. 9. In the embodiment, the structures, elements and functions of the heat dissipation assembly 1a are similar to those of the heat dissipation assembly 1 of FIGS. 1 to 5, and are not redundantly described herein. In the embodiment, the heat dissipation assembly 1a includes a fan 10a, a vapor chamber 20 and a heat dissipation fin set 30. The fan 10a includes a fan frame 11 and an impeller 12. The fan frame 11 includes an accommodation space 110. The impeller 12 is disposed on the bottom base of the fan frame 11 and accommodated in the accommodation space 110. Preferably but not exclusively, in the embodiment, the impeller 12 is a dense-metal-blade impeller and includes a plurality of metal blades 121 and a hub 122. The plurality of metal blades 121 having different blade lengths are disposed around the periphery of the hub 122 by means of injection molding. Moreover, the plurality of metal blades 121 are radially arranged on the periphery of the hub 121. In the embodiment, the vapor chamber 20 includes an upper plate 21 and a lower plate 22, spatially corresponding to each other and assembled to form the vapor chamber 20. Notably, the vapor chamber 20 formed and assembled by the upper plate 21 and the lower plate 22 is a bendable plate structure. In the embodiment, the lower plate 22 of the vapor chamber 20 has an extending section 22a extended to cover the fan frame 11. Moreover, the extending section 22a of the lower plate 22 is assembled with the fan frame 11 through the fastening element 16, so as to form an outlet 15. Preferably but not exclusively, in other embodiments, an extending section is provided and extended from the upper plate 2. In the embodiment, the extending section 22a of the lower plate 22 further includes an inlet 220 spatially corresponding to the impeller 12 and in communication with the outlet 15 through the accommodation space 110. The heat dissipation fin set 30 is spatially corresponding to the outlet 15 of the fan 10a, and preset on the lower plate 22 of the vapor chamber 20 by for example but not limited to welding. In the assembling process, the extending section 22a and the fan frame 11 are assembled through the fastening element 16, so as to obtain the heat dissipation assembly 1a. Since the lower plate 22 of the vapor chamber 20 and the extending section 22a are integrally formed into one piece, the assembling process is simplified by assembling the extending section 22a with the fan frame 11, and the heat dissipation efficiency between the fan 10a and the vapor chamber 20 is improved through the integrally formed lower plate 22. Certainly, the combination manner of the extending section 22a and the fan frame 11 is not an essential feature to limit the present disclosure. In other embodiments, the connection between the extending section 22a and the fan frame 11 are achieved by for example but not limited to welding. The present disclosure is not limited thereto and not redundantly described hereafter.

Notably, in the embodiment, a stacked vertical height H2 is formed between a top surface of the upper plate 21 of the vapor chamber 20 and a bottom surface 111 of the fan frame 11 in the Z axial direction. The stacked vertical height H2 is regarded as the height limit for the heat dissipation assembly 1a applied to the notebook case. In the embodiment, the vapor chamber 20 further includes a bent section 24 and a device-attaching section 23. The bent section 24 and the device-attaching section 23 are misaligned to the fan 10a in view of a vertical direction (i.e., the Z axial direction). Moreover, vertical heights of the bent section 24 and the device-attaching section 23 relative to the bottom surface 111 of the fan frame 11 are less than or equal to the stacked vertical height H2. In the embodiment, at least one heat-generating device 4 is attached to the device-attaching section 23, and the bent section 24 is disposed between the fan 10a and the device-attaching section 23. By adjusting the bent section 24, it allows to adjust the vertical heights of the heat-generating device 4 and the device-attaching section 23 relative to the bottom surface 111 of the fan frame 11 arbitrarily. Preferably but not exclusively, the vertical heights of the heat-generating device 4 and the device-attaching section 23 relative to the bottom surface 111 of the fan frame 11 are controlled and limited within the range of the stacked vertical height H2. Certainly, the present disclosure is not limited thereto.

Figure 11:
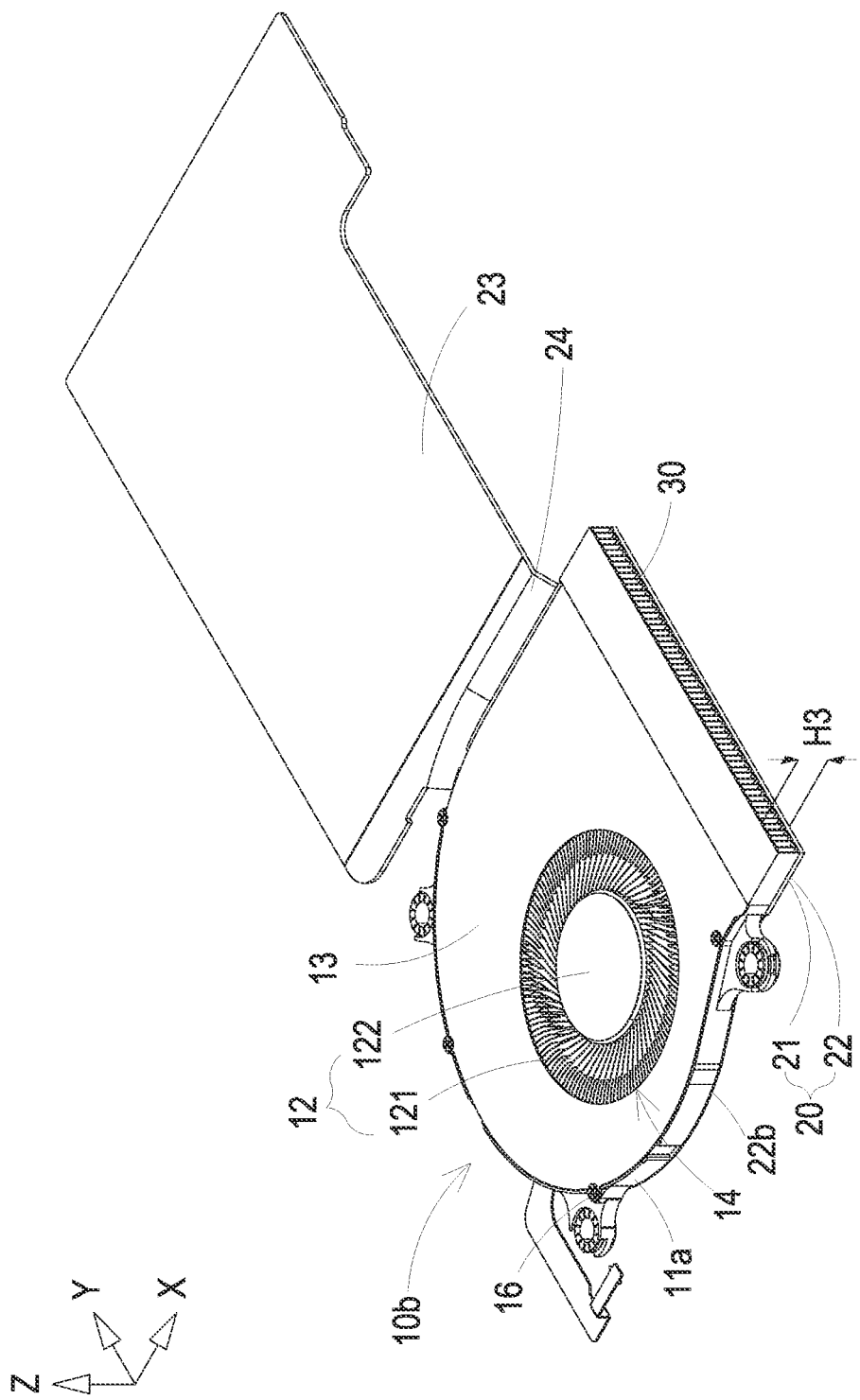
FIG. 11 is a perspective view illustrating a heat dissipation assembly according to a third embodiment of the present disclosure.
Figure 12:
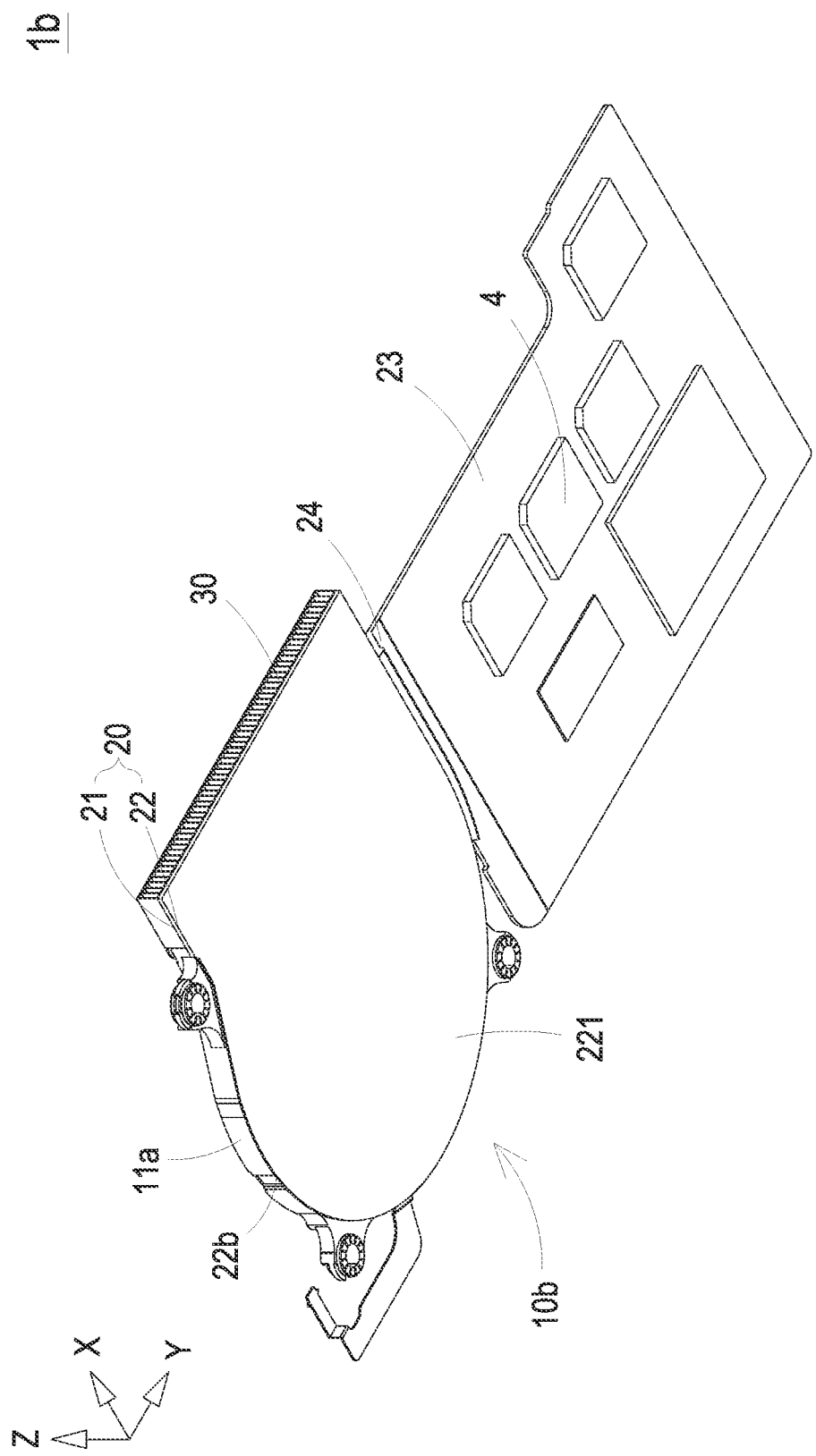
FIG. 12 is a perspective view illustrating the heat dissipation assembly according to the third embodiment of the present disclosure and taken from another perspective.
Figure 13:
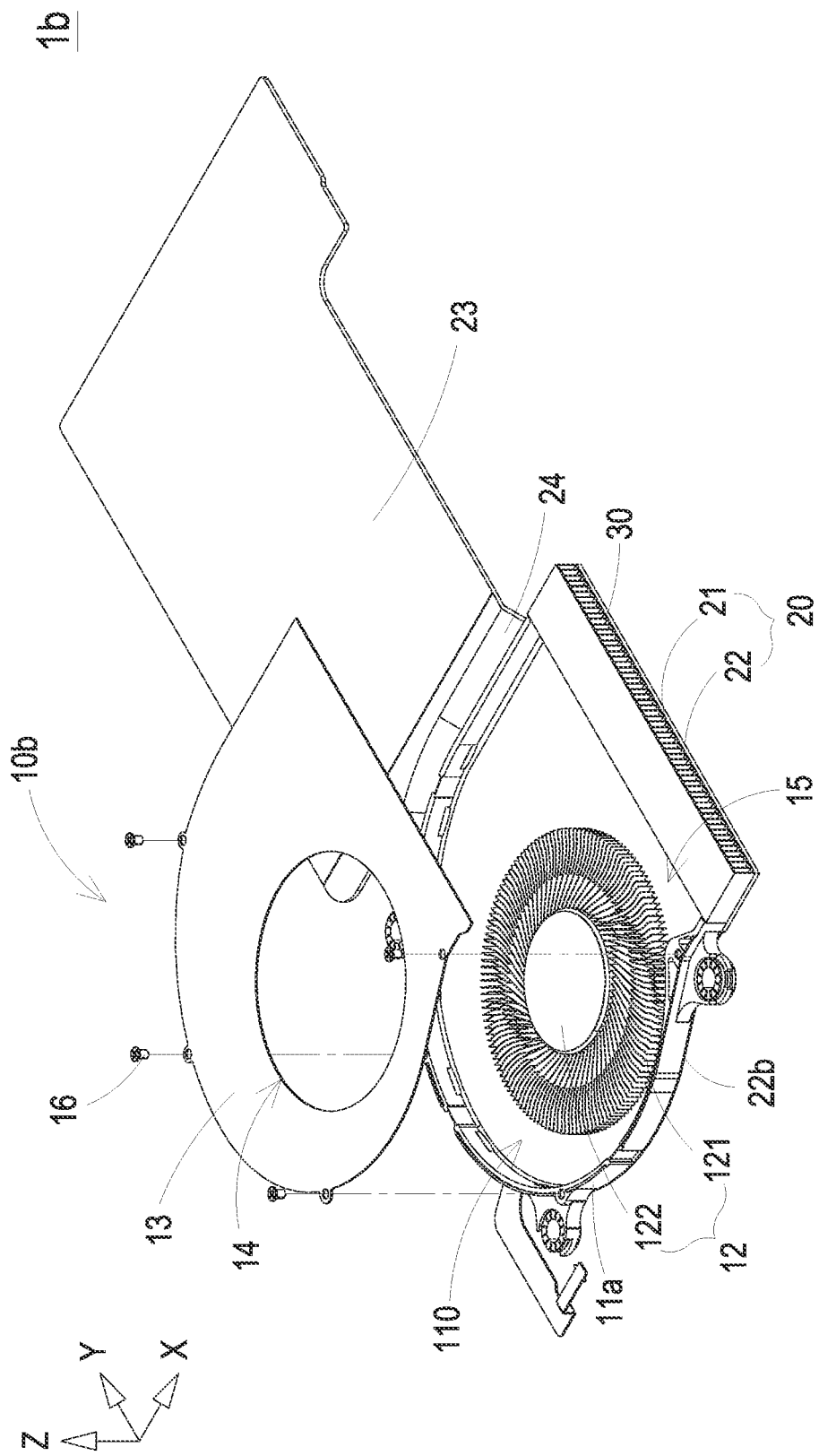
FIG. 13 is an exploded view illustrating the heat dissipation assembly according to the third embodiment of the present disclosure.
Figure 14:
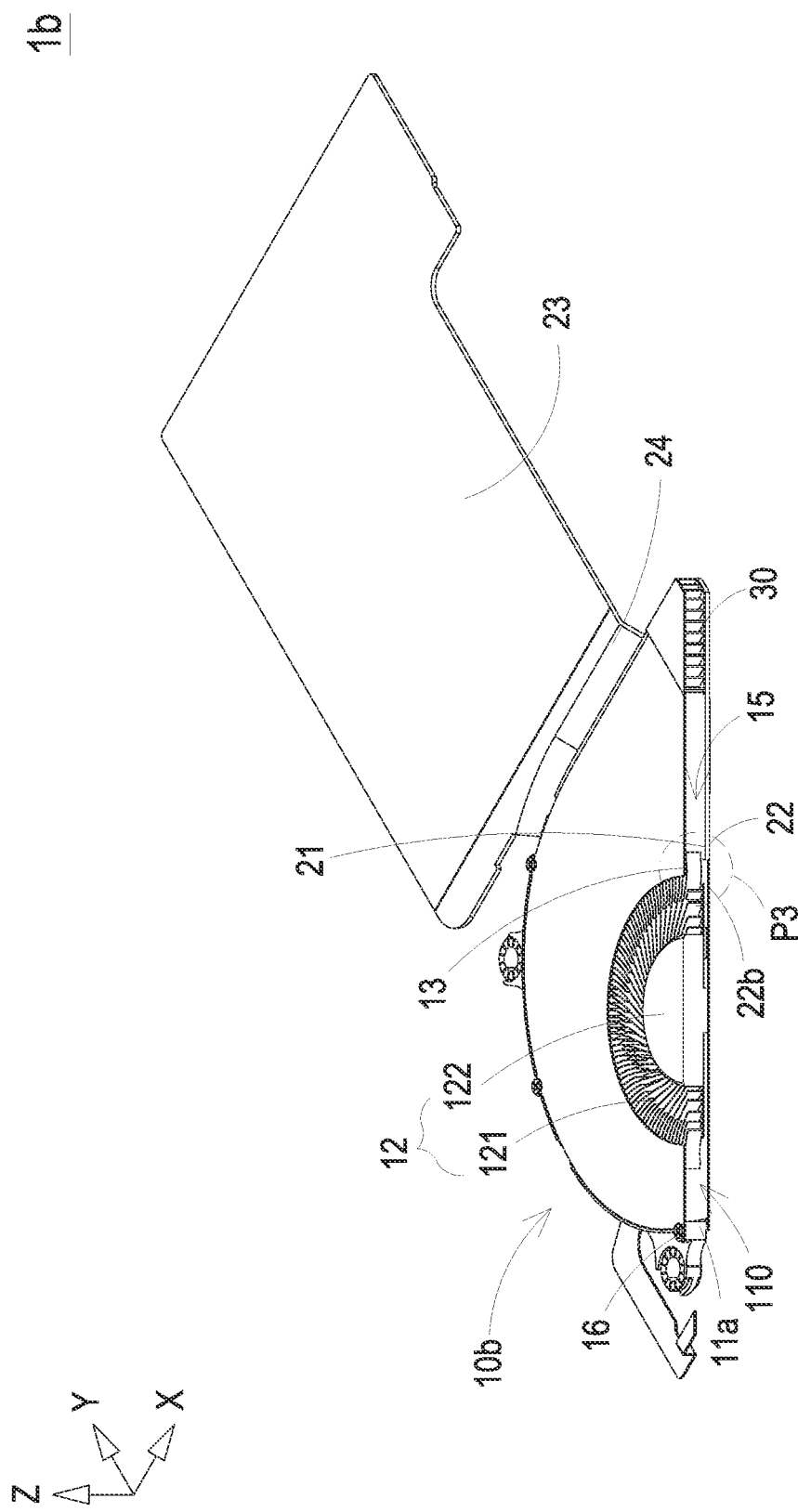
FIG. 14 is a cross-section view illustrating the heat dissipation assembly according to the third embodiment of the present disclosure.
Figure 15:
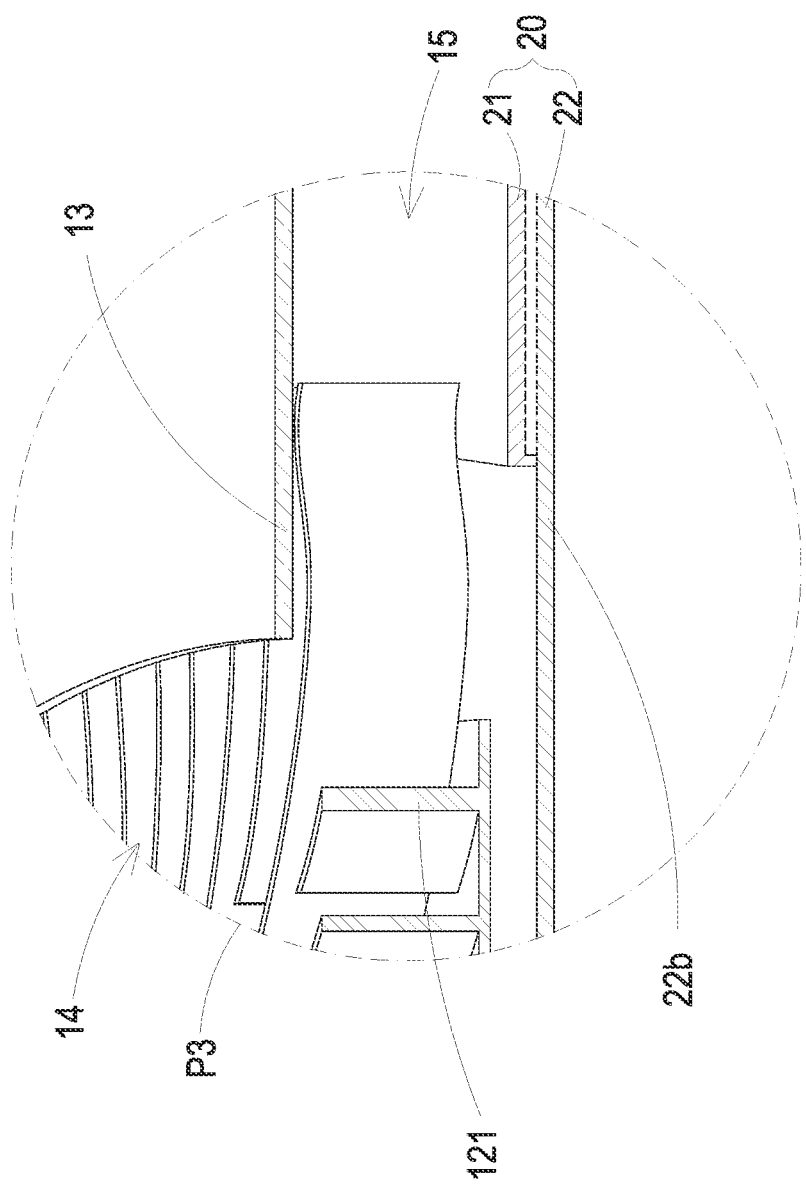
FIG. 15 is an enlarged view showing the region P3 in FIG. 14.

FIG. 11 and FIG. 12 are perspective views illustrating a heat dissipation assembly according to a third embodiment of the present disclosure. FIG. 13 is an exploded view illustrating the heat dissipation assembly according to the third embodiment of the present disclosure. FIG. 14 is a cross-section view illustrating the heat dissipation assembly according to the third embodiment of the present disclosure. FIG. 15 is an enlarged view showing the region P3 in FIG. 14. In the embodiment, the structures, elements and functions of the heat dissipation assembly 1b are similar to those of the heat dissipation assembly 1 of FIGS. 1 to 5, and are not redundantly described herein. In the embodiment, the heat dissipation assembly 1b includes a first fan 10b, a vapor chamber 20 and a first heat dissipation fin set 30. The vapor chamber 20 includes an upper plate 21 and a lower plate 22 spatially corresponding to each other and assembled to form the vapor chamber 20, which is a bendable plate structure. In the embodiment, the first fan 1b includes a first fan frame 11a, a first impeller 12 and a first fan cover 13. In the embodiment, the lower plate 22 of the vapor chamber 20 further includes an extending section 22b extended to cover the first fan frame 11a, and an accommodation space 110 is formed collaboratively by the first fan frame 11a and the extending section 22b of the lower plate 22. Preferably but not exclusively, the first fan frame 11a and the extending section 22b are connected by welding, gluing, snapping or locking. The present disclosure is not limited thereto. In the embodiment, the first impeller 12 is disposed on the extending section 22b and received in the accommodation space 110. Preferably but not exclusively, the first impeller 12 is a dense-metal-blade impeller and includes a plurality of metal blades 121 and a hub 122. The plurality of metal blades 121 having different blade lengths are disposed around the periphery of the hub 122 by means of injection molding. Moreover, the plurality of metal blades 121 are radially arranged on the periphery of the hub 121. In the embodiment, the first fan cover 13 is fixed to the first fan frame 11a through the fastening element 16. Furthermore, the first fan frame 11a and the extending section 22b of the lower plate 22 are connected through the first fan frame 11a to collaboratively form a first outlet 15. In the embodiment, the first fan cover 13 includes a first inlet 14 spatially corresponding to the first impeller 12 and in communication with the first outlet 15 through the accommodation space 110. The first heat dissipation fin set 30 is connected to the upper plate 21 and spatially corresponding to the first outlet 15. In the assembling process, the bottom portion of the first fan frame 11a and the bottom surface of the first heat dissipation fin set 30 are respectively connected to the extending section 22b and the upper plate 21 of the vapor chamber 20 by for example but not limited to welding. Then, the first fan cover 13 is assembled with the first fan frame 11a through the fastening element 16 and connected to the top surface of the first heat dissipation fin set 30, so as to complete the heat dissipation assembly 1b. Since the lower plate 22 of the vapor chamber 20 and the extending section 22b are integrally formed into one piece, and the first heat dissipation fin set 30 is thermally coupled between the first fan cover 13 and the vapor chamber 20, it is helpful of simplifying the assembling process, and the heat dissipation efficiency between the first fan 10b and the vapor chamber 20 is improved.

Notably, in the embodiment, a stacked vertical height H3 is formed between a top surface of the first fan cover 13 and a bottom surface of the lower plate 22 (including the extending section 22b) of the vapor chamber 20 in the Z axial direction. The stacked vertical height H3 is regarded as the height limit for the heat dissipation assembly 1b applied to the notebook case. In the embodiment, the vapor chamber 20 further includes a bent section 24 and a device-attaching section 23. The bent section 24 and the device-attaching section 23 are misaligned to the first fan 10b in view of a vertical direction (i.e., the Z axial direction). Moreover, vertical heights of the bent section 24 and the device-attaching section 23 relative to the bottom surface 221 of the extending section 22b of the lower plate 22 are less than or equal to the stacked vertical height H3. In the embodiment, at least one heat-generating device 4 is attached to the device-attaching section 23, and the bent section 24 is disposed between the first fan 10b and the device-attaching section 23. By adjusting the bent section 24, it allows to adjust the vertical heights of the heat-generating device 4 and the device-attaching section 23 relative to the bottom surface 221 of the extending section 22b arbitrarily. Preferably but not exclusively, the vertical heights of the heat-generating device 4 and the device-attaching section 23 relative to the bottom surface 221 of the extending section 22b are controlled and limited within the range of the stacked vertical height H3. Certainly, the present disclosure is not limited thereto.

Figure 16:
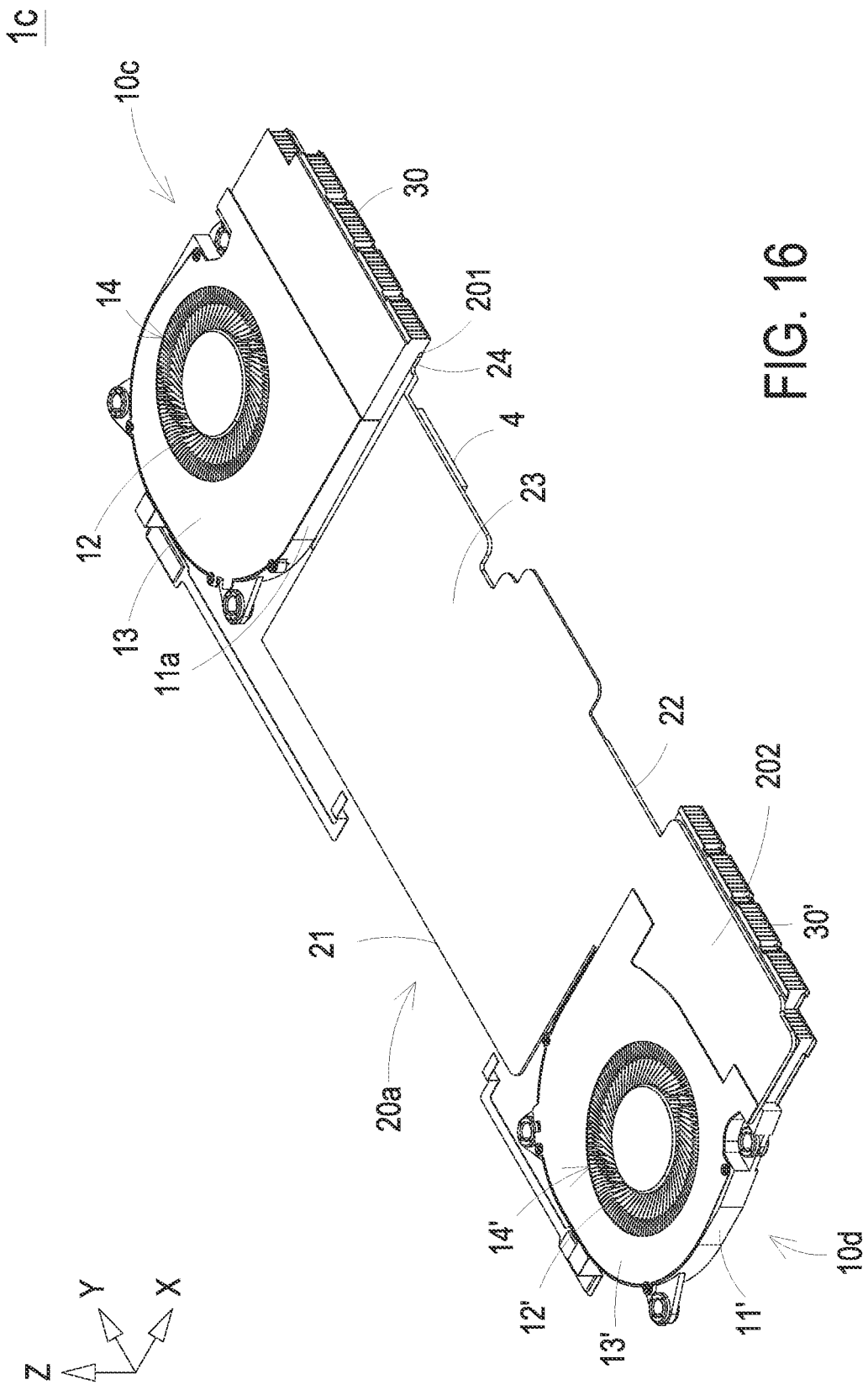
FIG. 16 is a perspective view illustrating a heat dissipation assembly according to a fourth embodiment of the present disclosure.
Figure 17:
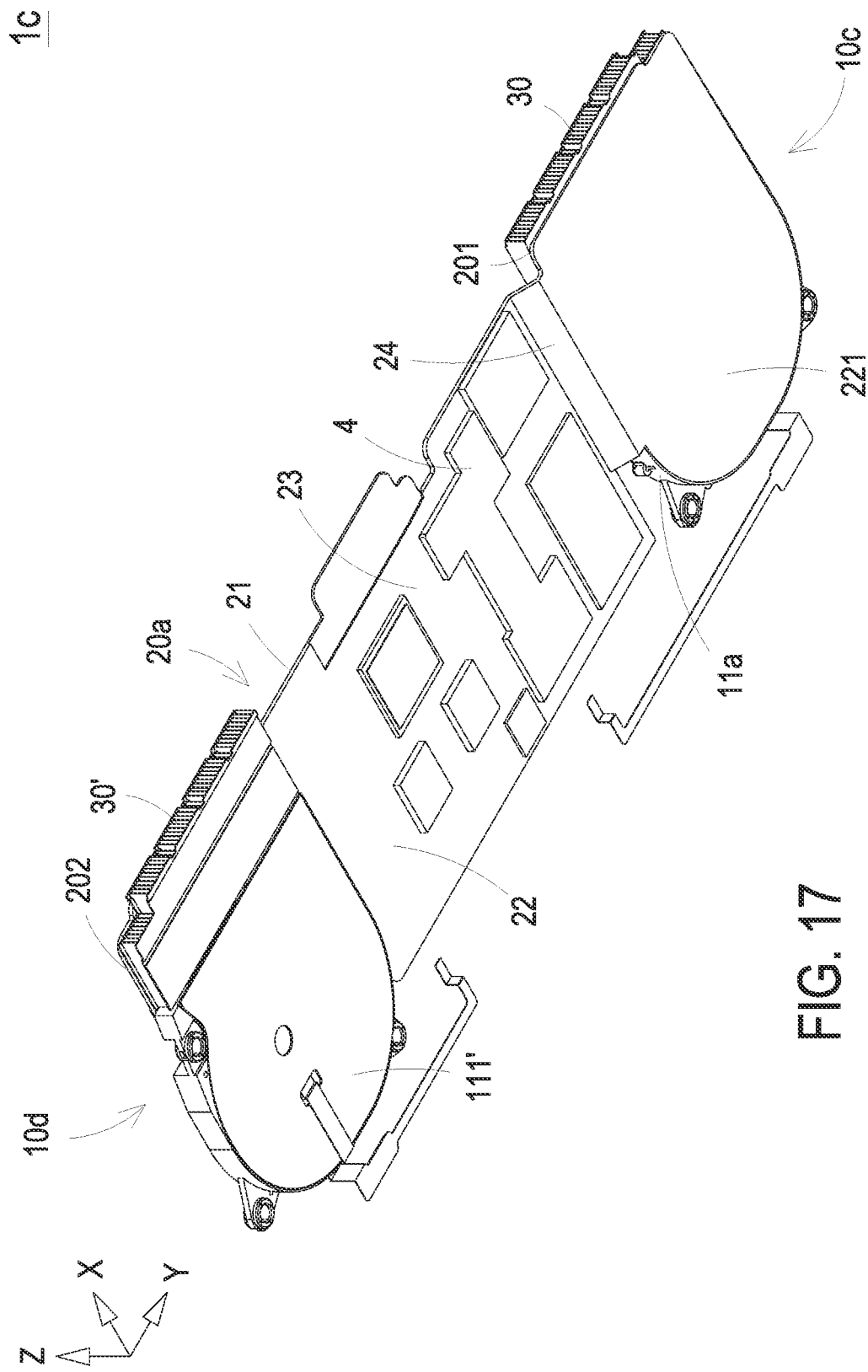
FIG. 17 is a perspective view illustrating the heat dissipation assembly according to the fourth embodiment of the present disclosure and taken from another perspective.
Figure 18:
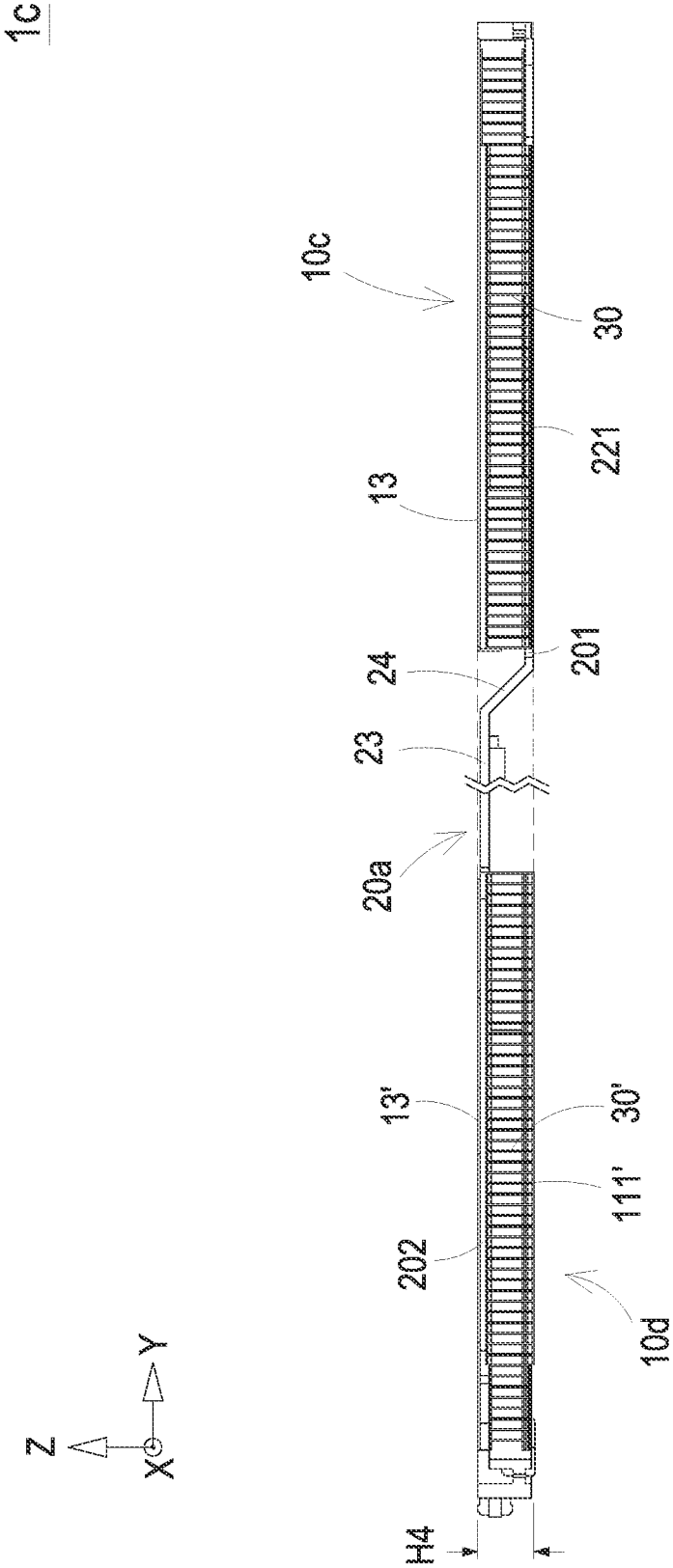
FIG. 18 is a front view illustrating the heat dissipation assembly according to the fourth embodiment of the present disclosure.

FIG. 16 and FIG. 17 are perspective views illustrating a heat dissipation assembly according to a fourth embodiment of the present disclosure. FIG. 18 is a front view illustrating the heat dissipation assembly according to the fourth embodiment of the present disclosure. In the embodiment, the structures, elements and functions of the heat dissipation assembly 1c are similar to those of the heat dissipation assembly 1 of FIGS. 1 to 5, and are not redundantly described herein. In the embodiment, the heat dissipation assembly 1c further includes a first fan 10c and a second fan 10d connected to the opposite lateral ends of the vapor chamber 20a, respectively, and thermally coupled to the upper plate 21 and the lower plate 22 of the vapor chamber 20a. In the embodiment, the vapor chamber 20a includes the upper plate 21 and the lower plate 22, spatially corresponding to each other and assembled to form the vapor chamber 20a, which is a bendable plate structure. In the embodiment, the structures, elements and functions of the first fan 10c is similar to those of the first fan 10b in the foregoing embodiment. The vapor chamber 20a further includes an extending section 201 included in the upper plate 21 or the lower plate 22 thereof, and served as the bottom base of the first fan 10c. Moreover, the first heat dissipation fin set 30 is thermally coupled to the upper plate 21 of the vapor chamber 20a by welding. After the first fan cover 13 is fixed to the first fan frame 11a, the assembly of the first fan 10c and the first heat dissipation fin set 30 is completed.

In the embodiment, the vapor chamber 20a further includes a bent section 24 and a device-attaching section 23. The bent section 24 and the device-attaching section 23 are misaligned to the first fan 10c in view of a vertical direction (i.e., the Z axial direction). At least one heat-generating device 4 is attached to the lower plate 22 in the device-attaching section 23, and the bent section 24 is disposed between the first fan 10c and the device-attaching section 23. By adjusting the bent section 24, the upper plate 21 in the device-attaching section 23 can be coplanar with the bottom surface of the first fan cover 13. In the embodiment, the vapor chamber 20a further include a horizontal combining section 202, which is extended horizontally from the device-attaching section 23. That is, the horizontal combining section 202 and the device-attaching section 23 have the same vertical height in the Z axial direction. In the embodiment, the horizontal combining section 202, the device-attaching section 23 and the bent section 24 are misaligned to the first fan 11c in view of the vertical direction (i.e., the Z axial direction). Therefore, it allows combining the horizontal combining section 202 with the heat-generating device 4 and other heat dissipation elements.

Notably, in the embodiment, the heat dissipation assembly 1c further includes a second fan 10d connected to the horizontal combining section 202 in the foregoing embodiment. In the embodiment, the structures, elements and functions of the second fan 10d is similar to those of the fan 10 in the first embodiment. In the embodiment, the second fan 10d includes a second fan frame 11', a second impeller 12' and a second fan cover 13'. The second impeller 12' is disposed in the second fan frame 11'. The second fan cover 13' and the second fan frame 11' are assembled to form a second outlet (Referring to the element 15 of FIG. 3). Moreover, the second fan cover 13' includes a second inlet 14' spatially corresponding to the second impeller 12' and in communication with second outlet. In the embodiment, when the second fan cover 13' and the second fan frame 11' are assembled, the horizontal combining section 202 is at least partially clamped between the second fan cover 13' and the second fan frame 11'. In that, the upper plate 21 and the lower plate 22 in the horizontal combining section 202 are thermally coupled to the second fan cover 13' and the second heat dissipation fin set 30', respectively. It is helpful of improving the heat dissipation efficiency between the second fan 10d and the vapor chamber 20a. Notably, the combination manner of the first fan 10c, the second fan 10d and the vapor chamber 20a is adjustable according to the practical requirements, and not limited to the foregoing embodiments.

In the embodiment, a stacked vertical height H4 is formed between a top surface of the first fan cover 13 and a bottom surface 221 of the lower plate 22 (including the extending section 22b) of the vapor chamber 20a, and/or a top surface of the second fan cover 13' and a bottom surface 111' of the second fan frame 11' in the Z axial direction. The stacked vertical height H4 is regarded as the height limit for the heat dissipation assembly 1c applied to the notebook case. In an embodiment, in case of that the stacked vertical height H4 formed between the top surface of the first fan cover 13 and the bottom surface 221 of the lower plate 22 (including the extending section 22b) is defined as the height limit for the heat dissipation assembly 1c, vertical heights of the top surface of the second fan cover 13' and the bottom surface 111' of the second fan frame 11' relative to the bottom surface 221 of the lower plate 22 (including the extending section 22b) of the vapor chamber 20a are less than or equal to the stacked vertical height H4, and vice versa. It won't be redundantly described hereafter.

In summary, the present disclosure provides a heat dissipation assembly. A dense-metal-blade fan and a vapor chamber are combined to optimize the stacked vertical height of the entire assembled structure, increase the thermal-conduction area and the heat-dissipation area, and improve the heat-dissipation efficiency at the same time. The vapor chamber is thermally coupled to the fan frame through the fan cover, or the upper or lower plate of the vapor chamber is extended to cover the fan frame to form the heat dissipation assembly. The assembling process is simplified. Moreover, the combination of the vapor chamber and the dense-metal-blade fan is allowed to form a smaller stacked vertical height. Furthermore, in case of that the system stacking space is limited, it is allowed to extend the vapor chamber horizontally to increase the overall heat-dissipation area and improve the heat-dissipation efficiency. By combining the vapor chamber and the dense-metal-blade fan, it has advantages of reducing the system stacking space and optimizing the heat-dissipation efficiency. When the vapor chamber is extended and combined with the fan frame as the base, and further combined with the heat dissipation fin set and assembled with the dense-metal-blade impeller, a smaller stacked vertical height is formed. The vapor chamber has a bent section connected to a device-attaching section thermally coupled with the heat-generating device, so as to achieve the heat dissipation of the heat-generating device outside the system In addition, the two opposite ends of the vapor chamber are allowed to connect and thermally coupled to the fan frame and the fan cover, respectively, through the upper plate or the lower plate of the vapor chamber, so as to increase the variability of multiple applications and enhance the competitiveness of the product. When a fan is combined with a vapor chamber and a heat dissipation fin set to form a heat dissipation assembly applied to an advanced notebook, it facilitates the dense-metal-blade impeller to exert the performance. That is, the frequency energy of the fan blades is dispersed evenly by using the fan blades with different blade lengths, the noise is reduce, and the performance is enhanced. Furthermore, with a larger heat-dissipation area and a larger heat-conduction area provided by the vapor chamber, the heat from the heat-generating device disposed outside the system is dissipated effectively through the combination of the vapor chamber, the fan and the heat dissipation fin set. On the other hand, the combination of the fan and the vapor chamber minimizes the stacked vertical height, and it is helpful of reducing the overall system stacking space, exerting the effect of reducing the temperature of the notebook case, and enhancing the competitiveness of the product.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat dissipation assembly comprising:
    a fan comprising a fan frame and an impeller, wherein the fan frame comprises an accommodation space, the impeller is disposed on the fan frame and accommodated in the accommodation space, and the impeller comprises a plurality of metal blades and a hub, wherein the plurality of metal blades are radially arranged on a periphery of the hub to form a dense-metal-blade impeller with a number of outer-ring blades greater than a number of inner-ring blades;
    a vapor chamber comprising an upper plate and a lower plate spatially corresponding to each other and assembled to form the vapor chamber, wherein the lower plate has an extending section extended to cover the fan frame, the extending section of the lower plate is assembled with the fan frame to form an outlet, and the extending section comprises an inlet spatially corresponding to the impeller and in communication with the outlet through the accommodation space; and
    a heat dissipation fin set connected to the lower plate and spatially corresponding to the outlet.

2. The heat dissipation assembly according to claim 1, wherein a stacked vertical height is formed between a top surface of the upper plate of the vapor chamber and a bottom surface of the fan frame, wherein the vapor chamber comprises a bent section and a device-attaching section, the bent section and the device-attaching section are misaligned to the fan in view of a vertical direction, and vertical heights of the bent section and the device-attaching section relative to the bottom surface of the fan frame are less than or equal to the stacked vertical height.

3. The heat dissipation assembly according to claim 2, wherein at least one heat-generating device is attached to the device-attaching section, and a thickness of the at least one heat-generating device is less than the stacked vertical height.

4. The heat dissipation assembly according to claim 1, wherein the extending section of the vapor chamber and the fan frame are assembled by a fastening element.

* * * * *